United States Patent [19]

Takemura

[11] 4,027,230
[45] May 31, 1977

[54] ELECTRONIC MULTI-CHANNEL SELECTION SWITCH WITH COMMON NEW-SELECTION SENSING DEVICE

[75] Inventor: Takehide Takemura, Hirakata, Japan

[73] Assignee: Matsushita Electric Industrial Co., Ltd., Japan

[22] Filed: Nov. 12, 1975

[21] Appl. No.: 630,961

[30] Foreign Application Priority Data
Dec. 4, 1974 Japan .......................... 49-139719
Dec. 4, 1974 Japan .......................... 49-139723

[52] U.S. Cl. .............................. 323/79; 307/252 C; 307/252 G; 323/17; 323/25; 325/464; 334/15
[51] Int. Cl.² .................................. G05F 1/10
[58] Field of Search ....... 307/252 C, 252 G, 252 K, 307/252 M; 325/464, 465; 334/15, 47; 323/16, 17, 21, 22 R, 22 SC, 25, 74, 79; 321/45 C

[56] References Cited
UNITED STATES PATENTS

| 3,404,287 | 10/1968 | Hubbard | 307/252 G |
| 3,588,541 | 6/1971 | Chan | 307/252 G |
| 3,740,651 | 6/1973 | Mons | 325/464 |
| 3,787,784 | 1/1974 | Mangold et al. | 334/15 X |
| 3,891,866 | 6/1975 | Okuhara et al. | 307/252 C |

Primary Examiner—Gerald Goldberg
Attorney, Agent, or Firm—Burgess Ryan and Wayne

[57] ABSTRACT

Electronic switches are used for switching the fine-tuning variable resistors in the electronic tuners of television receivers or stereophonic systems, and consist of a number of thyristors with P- and N-gates connected in parallel. The cathodes of the thyristors are connected in commmon, while a switch is connected to the anode circuits of said thyristors. A detector having an input connected to the N-gate circuits of the thyristors and an output connected to said switching means; and a number of input terminals each connected to the P-gate of each thyristor are also provided.

35 Claims, 10 Drawing Figures

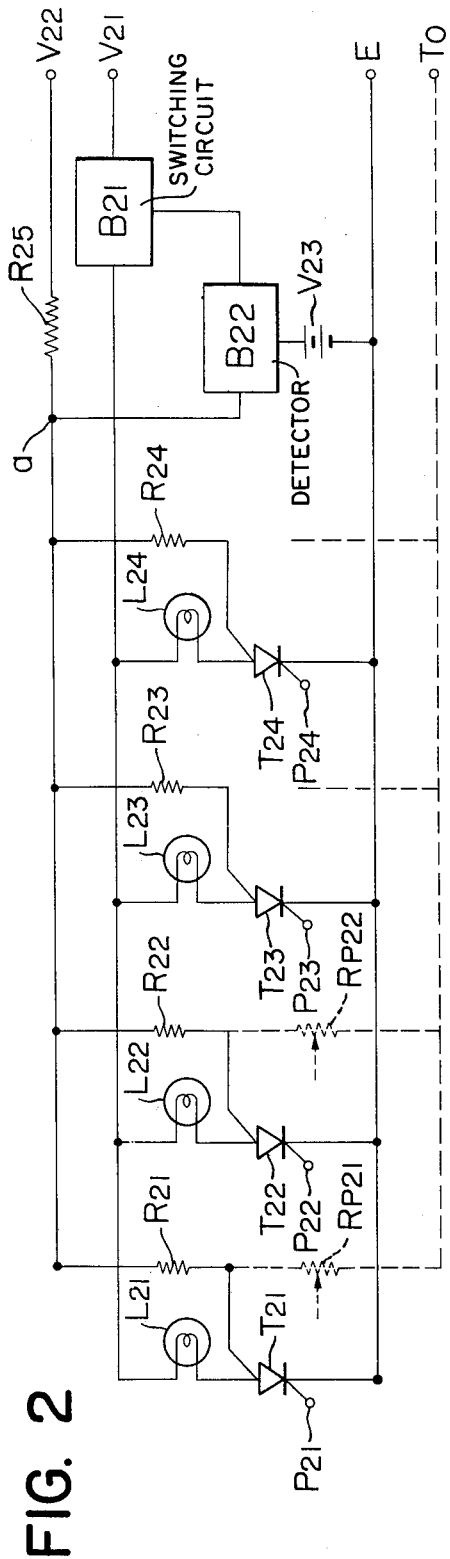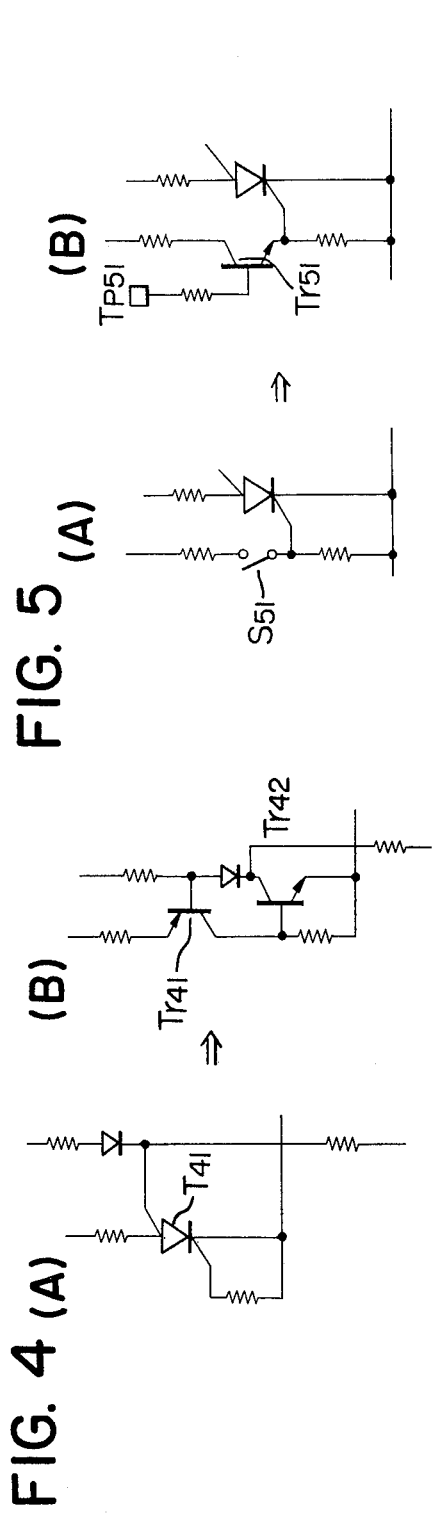

1

ELECTRONIC MULTI-CHANNEL SELECTION SWITCH WITH COMMON NEW-SELECTION SENSING DEVICE

BACKGROUND OF THE INVENTION

The present invention relates to a full-electronic switch for electronically switching electric circuits, and more particularly, an electronic switch for switching the fine-tuning variable resistors in the electronic tuners of television receivers or stereophonic systems. The function of the electronic switch is, therefore, similar to that of the mechanical multi-stage push-lock switch capable of resetting.

Various electronic switches are known. For instance, some electronic switches consist of combinations of logic circuits and ring counters, whereas other electronic switches consist of combinations of flip-flop means. In general, these electronic switches are used for switching fine-tuning variable resistors in electronic tuners of television receivers or stereophonic systems, but they are still expensive at present so that there has been the strong demand for less expensive electronic switches.

SUMMARY OF THE INVENTION

One of the objects of the present invention is therefore to provide inexpensive electronic switches.

Another object of the present invention is to provide an electronic switch free from a malfunction even when more than two switches are simultaneously operated.

A further object of the present invention is to provide an electronic switch incorporating visual display neon bulbs.

A further object of the present invention is to provide an electronic switch which may be remotely controlled in response to an external control signal.

The above and other objects of the present invention are accomplished by an electronic switch comprising a plurality of thyristors each with P- and N-gates, which are connected in parallel in such a way that their cathodes are connected in common; switching means connected to the anode circuits of the thyristors; detector means whose input is connected to the N-gate of each thyristor and whose output is connected to said switching means, and a plurality of input terminals each connected to the P-gate of each thyristor.

BRIEF DESCRIPTION OF THE DRAWING:

FIG. 2 is a fundamental circuit diagram of the electronic switch in accordance with an present invention;

FIG. 4A is a circuit diagram of a thyristor used in the present invention;

FIG. 4B shows an equivalent circuit thereof;

FIG. 5A is a circuit diagram of a switch used in the present invention;

FIG. 5B shows an equivalent circuit thereof; and

DESCRIPTION OF THE PREFERRED EMBODIMENTS

Figure 1:
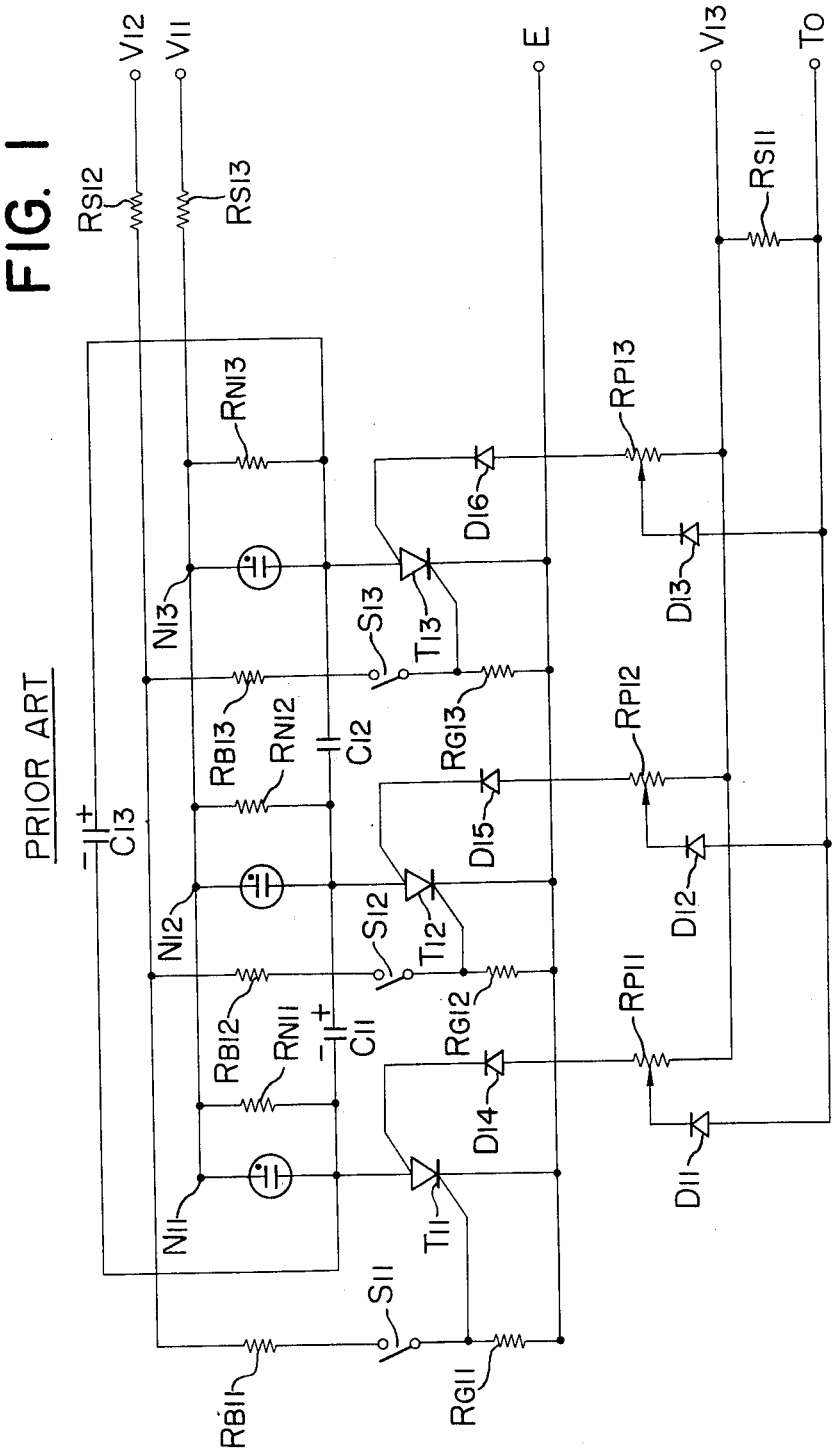
FIG. 1 is a circuit diagram of a prior art electronic switch.

Prior Art, FIG. 1

Referring to FIG. 1, there is shown the prior art electronic switch proposed by the same inventor in order to reduce the cost, and reference characters T11 through T13 denote thyristors each having an N-gate and P-gate and whose cathodes are connected in common; N11 through N13, display devices or neon bulbs each having one electrode connected to the anode of the corresponding thyristor T; $R_{N11}$ through $R_{N13}$, resistors each connected in parallel with the corresponding neon bulb N; S11 through S13; switches each for actuating the corresponding thyristor T;Rs12, $R_{B11}$ through $R_{B13}$ and Rg11 through Rg13, voltage dividing resistors;Rs13, a series resistor;Rp11 through Rp13, trimmer resistors for fine adjustment;D11 through D13, diodes each connected to the wiper or movable arm of the trimmer resistors;Rs11, a resistor for biasing the diodes D;C11 through C13, commutation capacitors interconnected between the neon bulbs N; and D14 through D16, current-limiting diodes connected to the N-gates of the thyristors T.

Voltages V11, V12 and V13 are applied to the terminals. When the switch S11 is closed, (It is not necessary to keep it closed.), the current flows into the P-gate of the thyristor T11, resulting in the turned-on thyristor T11 and the turned-on neon-bulb N11. The current also flows through the trimmer resistor Rp11 so that the voltage output, the magnitude of which is determined by the trimmer resistor Rp11, is derived from the output terminal To. In this case, the remaining thyristors T12 and T13 and neon bulbs N12 and N13 remain turned off, and no current flows through the trimmer resistors Rp12 and Rp13. The commutation capacitors C11 and C13 are charged, but the capacitor C12 is not charged because the voltage difference across it is zero. When switch S12 is closed, the gate current flows into the thyristor T12, resulting in the turned-on thyristor T12. Then, the turned-on thyristor T11 is reverse biased by the commutation capacitor C11 for a predetermined time (in order of tens of microseconds) so that it is turned off, resulting in the turned-off neon bulb N11. No current flows through the trimmer resistor Rp11. Since the thyristor T12 is turned on, the associated neon bulb N12 is turned on, and the current flows through the associated trimmer resistor Rp12, whereby the output voltage, the magnitude of which is dependent upon the resistor Rp12, may be derived from the output terminal To.

As described above, the closing of the switch S12 causes the conduction of the thyristor T12 and extinguishes the thyristor T11, and then the thyristor T12 remains turned on. That is, when one of the switches S is closed, the corresponding thyristor T is turned on while the thyristor T which has been kept turned on, is turned off by the current discharged from the associated commutation capacitor C. In FIG. 1, only three thyristors T are shown, but this number may be increased or reduced as needs demand; but the mode of operation is substantially similar to that described above.

When the neon bulbs N having a relatively high impedance are included in the anode circuits of the thyristors, commutation capacitors of a relatively small value may be used. However, when the neon bulbs are replaced by the lamps with the ratings of 12 V and 50 mA and a relatively very low impedance, the commutation capacitors with a relatively high value must be used in order to provide the same reverse bias time an that provided by the commutation capacitors when the neon bulbs are included. For instance, when the neon bulbs are used, the value of the commutation capacitors used is 0.005 μF, but when the lamps with the rating of 6 V and 50 mA are included instead of the neon bulbs, the value of the commutation capacitors must be increased to 2.5 μF. That is, the non-polarized, high-capacitance capacitors capable of withstanding the rapid switching between charging and discharge must be used as the commutation capacitors. Such capacitors are generally large and very expensive, thus resulting in large-sized and expensive electronic switches.

The present invention overcomes the above disadvantages of the prior art electronic switches of the type described above and which had been the least expensive one ever manufactured, and the present invention provides, as its primary object, an improved electronic switch which may be manufactured at a cost substantially similar to that of the electronic switch of the type shown in FIG. 1 even though the display lamps other than the low-impedance neon bulbs are included.

THE INVENTION

Fundamental Circuit, FIG. 2

Referring to FIG. 2, there is shown the diagram of the fundamental electronic switch circuit in accordance with the present invention, and T21 through T24 denotes thyristors whose cathodes are connected in common; R21 through R25, resistors each connected to the N-gate of the thyristor T;L21 through L24, display devices or lamps each connected to the anode circuit of the thyristor T; B21, a switching circuit so arranged as to interrupt the anode circuits of the thyristors T; B22 a detector adapted to detect the voltage at the common junction $a$ of the N-gate circuits of the thyristors T for controlling the switching circuit B21; and V23, a reference voltage supply for supplying the reference voltage to be compared with the voltage detected at the common junction $a$.

Next, the mode of operation will be described. The predetermined voltages V21 and V22 are applied to the input terminals, and are, for instance, 12 V and 30 V, respectively. In response to the input pulse applied to the P-gate P21 of the thyristor T21, the latter is turned on so that the lamp L21 is turned on. The voltage at the N-gate of the thyristor T21 is substantially equal to the ground potential (that is, the cathode potential of the order of a few tens of microvolts) so that the current flows through the resistors R25 and R21. As a result, the voltage at the common junction $a$ is $Ea21$ is dependent upon the values of the resistors R25 and R21. However, no current flows through the remaining resistors R22, R23 and R24. The voltage $Ea21$ is higher than the reference voltage V23, the output from the switching circuit B21 maintains the thyristor T21 on. When the second thyristor T22 is turned on in response to the input applied to the P-gate P22, the current flows through the resistors R25, R21 and R22 so that the voltage at the common junction $a$ drops to $Ea22$ which is lower than the reference voltage V23. As a result, the detector B22 gives no output signal to the switching circuit B21 so that the latter is turned off to interrupt the anode circuits of the thyristors T21 and T22. That is, the anode current interruption is effected. Therefore, both the thyristors T21 and T22 are turned off so that no current flows through the resistors R21 and R22 connected to the N-gate of the thyristors T21 and T22. Then, the voltage at the common junction $a$ rises above the reference voltage V23 so that the detector B22 gives the output signal to the switching circuit B21. As a result, it re-establishes the anode circuits of the thyristors T21 through T24. In this case, if the input is kept applied to the P-gate P22, of the second thyristor T22 the latter is turned on. That is, the input pulse applied to the gate P22 causes the conduction of the thyristor T22 and extinguishes the turned-on thyristor T21. The transient time is of the order of a few tens of microseconds. Therefore, when the input application time that is, the time when the input is applied to any of P-gates, P is longer than the transient time, the positive transistion from one thyristor to another may be effected.

Thus, it is seen that the present invention may eliminate the commutation capacitors used in the electronic switch shown in FIG. 1 as well as the effect of the impedance of the lamps L connected to the anodes of the thyristors T upon the switching operation. According to the present invention, the switching operation from one thyristor to another is effected in response to the voltage detected at the common junction $a$ so that there is no fear at all that the thyristor is turned on again unless the input signal is applied to the P-gate thereof. In the prior art electronic switch shown in FIG. 1, there is a fear that the thyristor is turned on again when the input is applied to the P-gate for a time equal to or longer than the reverse bias time. This defect may be completely eliminated by the present invention.

For the purpose of the adjustment of the operating conditions, the trimmer resistors Rp21 and Rp22 may be connected to the N-gates of the thyristors T21 and T22, respectively, as indicated by the dotted lines in FIG. 2.

Figure 3:
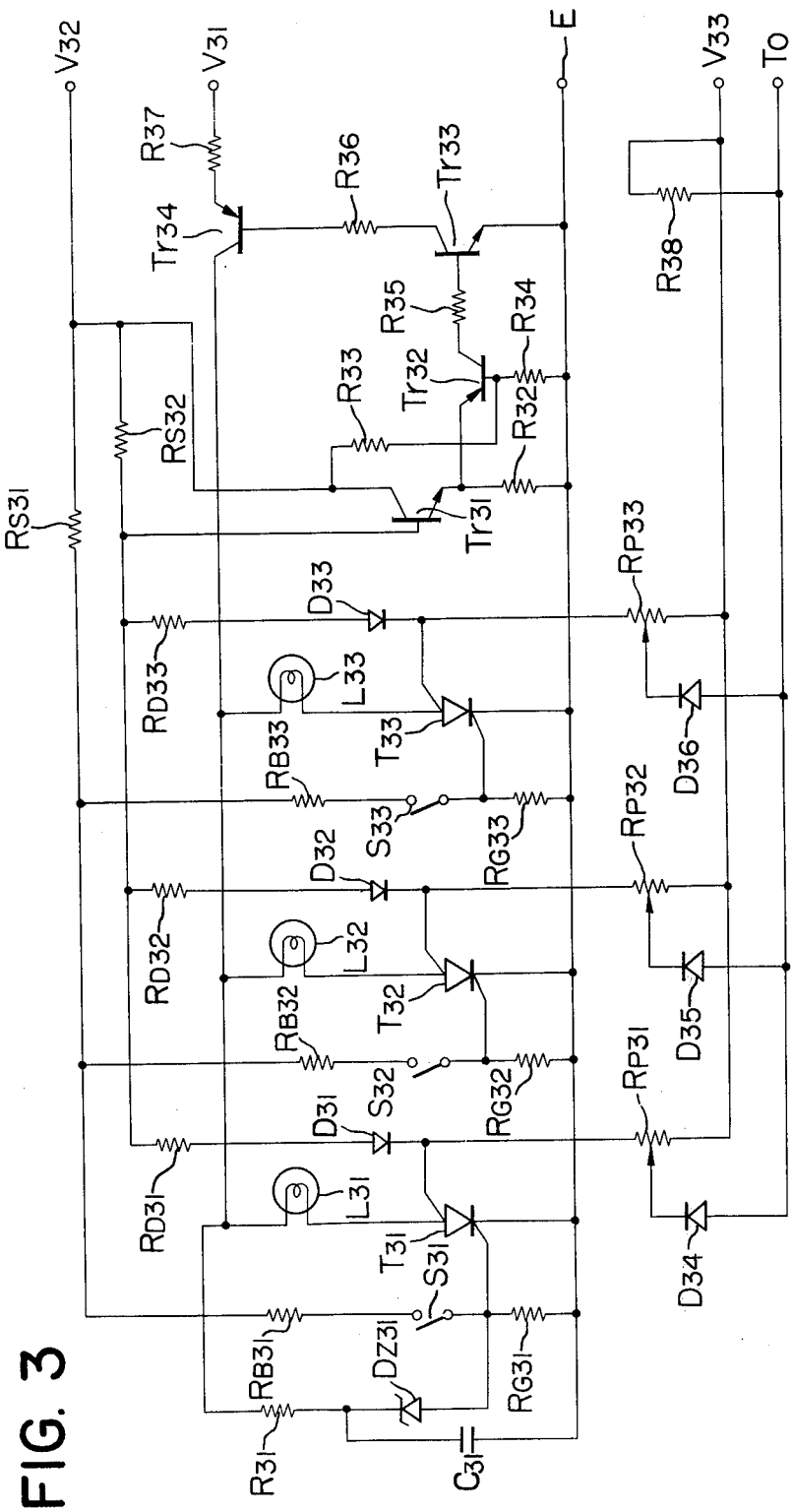
FIG. 3 is a circuit diagram of a first embodiment of the present invention.

First Embodiment, FIGS. 3, 4 and 5

Next referring to FIG. 3, the first embodiment of the present invention will be described. Tr31 and Tr32 are transistors which constitute the detector B22 of the fundamental circuit shown in FIG. 2; Tr33 and Tr34, transistors constituting the switching circuit B21; R33 and R34, resistors constituting the reference voltage supply V23; Dz31, a zener diode with the breakover voltage $V_z$; $R_{D31}$, $R_{D32}$ and $R_{D33}$, resistors each connected to the N-gate circuit of the thyristor T; Rs31, a common resistor; Rs32, a common resistor connected to the N-gate circuits of the thyristors T; $R_{B31}$, $R_{B32}$ and $R_{B33}$, resistors each connected to the P-gate circuit of the thyristor T; $R_{G31}$, $R_{G32}$ and $R_{G33}$, gate resistors each connected to the P-gate circuit of the thyristor T; R31, a current-limiting resistor connected to the zener diode Dz31; C31, a capacitor connected in order to provide some time delay, thereby preventing the unstable switching operation; S31 through S33, switches; T31 through T34, thyristors;L31 through L33, display lamps; D31 through D36, diodes; Rp31 through Rp33, trimmer resistors; and R36 through R38, resistors.

In the instant embodiment, the stable voltages V31, V32 and V33 applied to the input terminals are 12 V, 30 V and 30 V, respectively. When all of the switches S31 through S33 are opened, all of the thyristors T31 through T33 remain turned off so that the collector voltage of the transistor Tr34 equals the voltage V31, which is higher than the breakover voltage $V_z$ of the zener diode Dz31, thus resulting in the breakdown thereof. Consequently, the current flows through the resistor $R_{G31}$ so that the trigger signal is applied to the P-gate of the thyristor T31, resulting in the conduction thereof. Then, because of the voltage drop across the resistor R37, the collector voltage of the transistor Tr34 drops below the breakdown voltage Vz of the zener diode Dz31. Thus, when the electronic switch is connected to the power supply, the thyristor T31 conducts in the manner described above, and when the switches S31 through S33 are kept opened.

When any of the switches S, for instance, the switch S32 is closed under the above described conditions, (the ON time of the switch S32 is longer than the transient time of the order of a few tens of microseconds), the trigger signal is applied to the P-gate of the thyristor T32, resulting in the conduction thereof. Then, the current flows through the resistor $R_{D32}$ connected to the N-gate circuit of the thyristor T32 so that the base voltage of the transistor Tr31 drops below a voltage which is determined by the voltage-dividing resistors R33 and R34. As a result, the base-emitter of the transistor Tr32 is reverse biased so that the transistor Tr32 is turned off. Therefore, the base current to the transistor Tr33 is interrupted, in the zero collector current thereof, that is, the zero base current flows into the transistor Tr34, whereby the latter is turned off. The thyristor T31 is therefore turned off so that no current flows through the resistor $R_{D31}$. The base voltage of the transistor Tr31 rises above the voltage determined by the voltage dividing resistors R33 and R34 so that the transistors Tr32 through Tr34 are turned on. As a result, the anode current flows into the thyristor T32, whereby the latter is turned on and the output voltage, which is determined by the trimmer resistor $R_{p32}$, is derived from the terminal To.

The diodes D31 through D33 are included in order to prevent the current flowing into the trimmer resistors $R_{p31}$ through $R_{p33}$ because the voltage V33 is higher than the base voltage of the transistor Tr31 in the steady state.

Next, the common gate resistor Rs31 which is connected in common to the P-gate circuits of the thyristors T31 through T33 and which is one of the important features of the present invention, will be described. When, for instance, the switch S31 is closed when the switches S31 through S33 have remained open, the gate voltage of the thyristor T31 rises to 0.7 to 0.8 V, which is determined by the combination of the resistors Rs31, $R_{B31}$ and $R_{G31}$, so that the thyristor T31 is turned on. The same is true for the other switches S32 and S33. When both or either of the switches S32 and S33 are closed when the switch S31 remains closed, and if the P-gate voltage of the thyristors T32 and T33 rises above the turning-on voltage, the thyristors T32 and T33 will be turned on so that the anode circuits are interrupted, resulting in the malfunction of the electronic switch. The common gate resistor Rs31 is therefore included in order to prevent such malfunction. That is, when the switch S32 is closed when the switch S31 remains closed, the current flows through both the gate voltage dividing resistors $R_{B31}$ and $R_{B32}$, whereby the voltage drop across the gate common resistor Rs31 is increased. As a result, the gate voltage of the thyristor T32 cannot rise to the breakover voltage. Thus, the malfunction or mis-firing of the thyristor T32 may be prevented. It is apparent to those skilled in the art that when both the switches S31 and S32 are closed, the thyristor T31 is kept turned on and that when the switch S31 is opened, the thyristor T31 is turned off while the thyristor T32 is turned on.

In the prior art electronic switch, the malfunction occurs when more than two switches are closed, but in accordance with the present invention, such malfunction may be completely eliminated only by connecting the common gate resistor Rs31.

The thyristors T with the P- and N-gates may be replaced by the suitable combinations of an NPN and PNP transistors. For example, FIG. 4(B) shows one combination of a PNP transistor Tr41 and an NPN transistor Tr42 which combination is electrically equivalent to the thyristor T41 shown in FIG. 4(A) and used in the first embodiment. Strictly speaking, in order to provide the equivalent circuit for the circuit shown in FIG. 4(A), the base of the transistor Tr41 must be connected to the collector of the transistor Tr42, but the circuit shown in FIG. 4(B) is somewhat modified in order to prevent the reverse bias voltage from being applied across the base-emitter junction of the transistor Tr41.

So far, the switches S have been described and shown as being the mechanical switches, but the mechanical switch S51 shown in FIG. 5(A) may be replaced by an electronic switch consisting of a transistor Tr51 and an exposed conductor $T_{p51}$. In other words, any suitable means capable of an on-off switching function may be used as the switch S.

Figure 6:
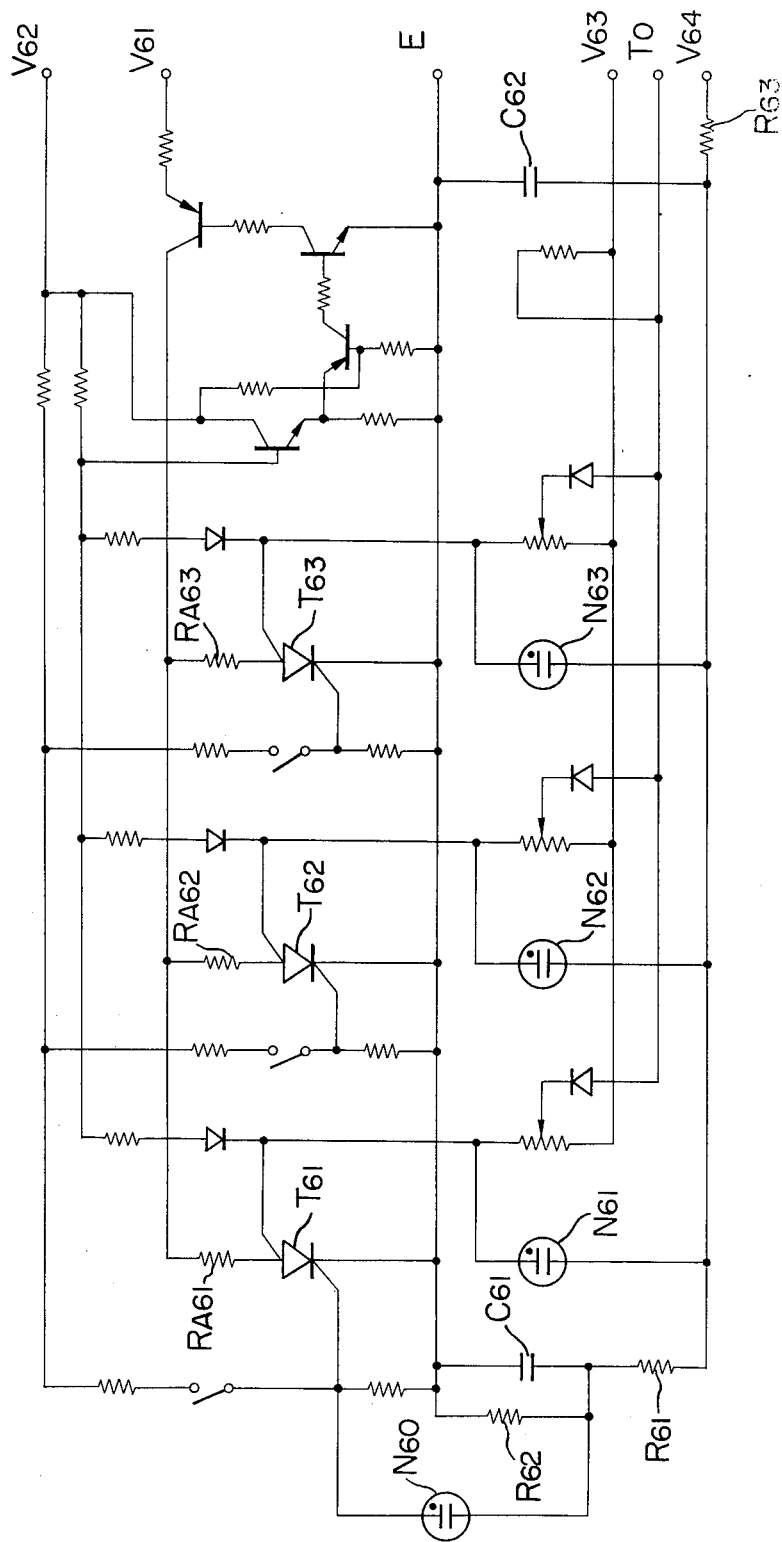
FIG. 6, 7 and 8 are circuit diagrams of second, third and fourth embodiments, respectively, of the present invention.

Second Embodiment, FIG. 6

As described hereinbefore, the electronic switch in accordance with the present invention, is adapted to employ the high impedance elements such as display lamps which are connected to the anodes of the thyristors, but the neon bulbs may be also employed as will be described hereinafter with reference to FIG. 6.

Referring to FIG. 6, there is shown the second embodiment of the electronic switch in accordance with the present invention, which is substantially similar in construction to the first embodiment except that instead of the display lamps L, resistors $R_{A61}$ through $R_{A63}$ are connected to the anodes of the thyristors T61 through T63 and that instead of the zener diode Dz, a neon bulb N60 is connected. Furthermore, the second embodiment includes display neon bulbs N61, N62 and N63, a current-limiting resistor R63, a voltage divider consisting of resistors R61 and R62, a capacitor C61 for providing time delay and for turning on the thyristor T61, and a capacitor C62 for delaying the time when the neon bulb N is fired with respect to the time when the associated thyristor T is conducted. The voltages V61, V62 and V63 impressed correspond to the voltages V31, V32 and V33 shown in FIG. 3, and the voltage V64 is higher than the firing or ionization potential of the neon bulbs N61, N62 and N63.

Next, the mode of operation will be described. It is assumed that initially the thyristor T61 is turned on. Then, the neon bulb N61 is turned on, and the remaining thyristors T62 and T63 are turned off. Therefore, the voltage (VK − V63) (where VK = firing potential of neon bulbs N61 through N63 and 60 V, and V63 = 30 V, in the instant embodiment) is impressed across the neon bulbs N62 and N63. Since the voltage VK − V63 is of course lower than the firing potential, the neon bulbs N62 and N63 remain turned off. However, when their associated thyristors T62 and T63 are turned on, they are also turned on.

Next, the function of the neon bulb N60 will be described. It is assumed that when the electronic switch is connected to the power supply, all of the thyristors T61 through T63 are initially turned off. Then, the neon bulb N60 is impressed with the voltage V64 and is turned on so that the thyristor T61 is turned on. Since the neon bulb N60 is turned on, the voltage across the neon bulb N61 is divided by the resistors R61 and R62 so that it is lower than the firing potential of the neon bulb N61. As described hereinbefore, all of the thyristors T61 through T63 are turned off for tens of microseconds when one thyristor is turned off and another thyristor is to be turned on so that if the capacitor C62 were not connected, the voltage impressed across the neon bulbs N61 through N63 would abruptly increase to V64 − V63. However, since the capacitor C62 is connected, the neon bulb N61, N62 or N63 may be turned on after a suitable time delay.

Figure 7:
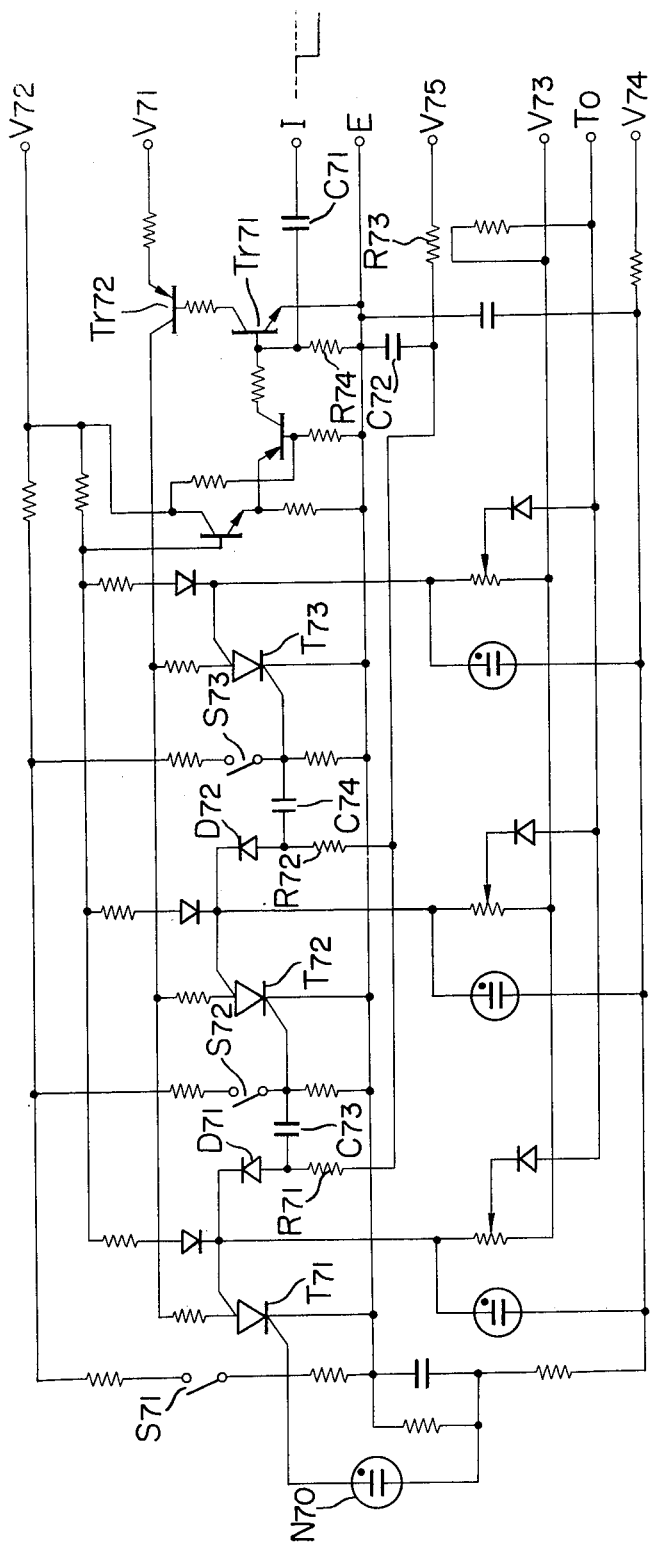

Third Embodiment, FIG. 7

The third embodiment shown in FIG. 7 is a remote-controlled electronic switch which is substantially similar in construction to the second embodiment shown in FIG. 6 except that the third embodiment further includes capacitors C71 through C74, resistors R71 through R73, diodes D71 and D72, a voltage supply V75 for remote control, and a remote-control pulse signal input terminal I.

It is assumed that the remote-controlled switch is connected to the power supply so that the thyristor T71 is turned on as the neon bulb N70 is turned on in the manner described above. Then, the current from the remote-control voltage supply V75 (which supplies 30 V in the instant embodiment) flows through the resistor R71 so that the capacitor C73 is not charged. However, since the thyristor T72 is turned off so that the capacitor C74 is charged through the resistor R72 to V75 (that is, 30 V). When the negative step pulse arrives at the input terminal I, the output pulse from a differentiating circuit consisting of the capacitor C71 and the resistor R74 is applied to the base of a transistor Tr71 so that the transistors Tr71 and Tr72 are momentarily turned off for a time depending upon the time constant of the differentiating circuit. As a result, the thyristor T71 is turned off so that the capacitor C73 is charged through the resistor R71 and consequently the thyristor T72 is turned on. Since the capacitor C74 has been already charged, the thyristor T73 remains off. After the thyristor T72 has been turned on, the capacitor C74 is discharged. In like manner, in response to the next pulse signal applied to the input terminal I, the thyristor T73 is turned on whereas the thyristor T72 is turned off. In response to the third input pulse, all the thyristors T71 through T73 are turned off, but the thyristor T71 is turned on in the manner described above. Thus, in response to the input pulses, one thyristor is turned off whereas another thyristor is turned on. The switching operation may be also accomplished by closing the switches S71 through S73 in the manner described above. When the remote control is not necessary, the remote-control voltage supply V75 may be disconnected or reduced to 0 V. The capacitor C72 is connected in order to prevent the remote control pulse signals from being impressed to the gates of the thyristors T71 through T73 and being turned.

So far the thyristors T have been described as being turned on and off cyclically from the right to left, but the turned-on thyristors may be shifted in either direction as will be described hereinafter.

Figure 8:
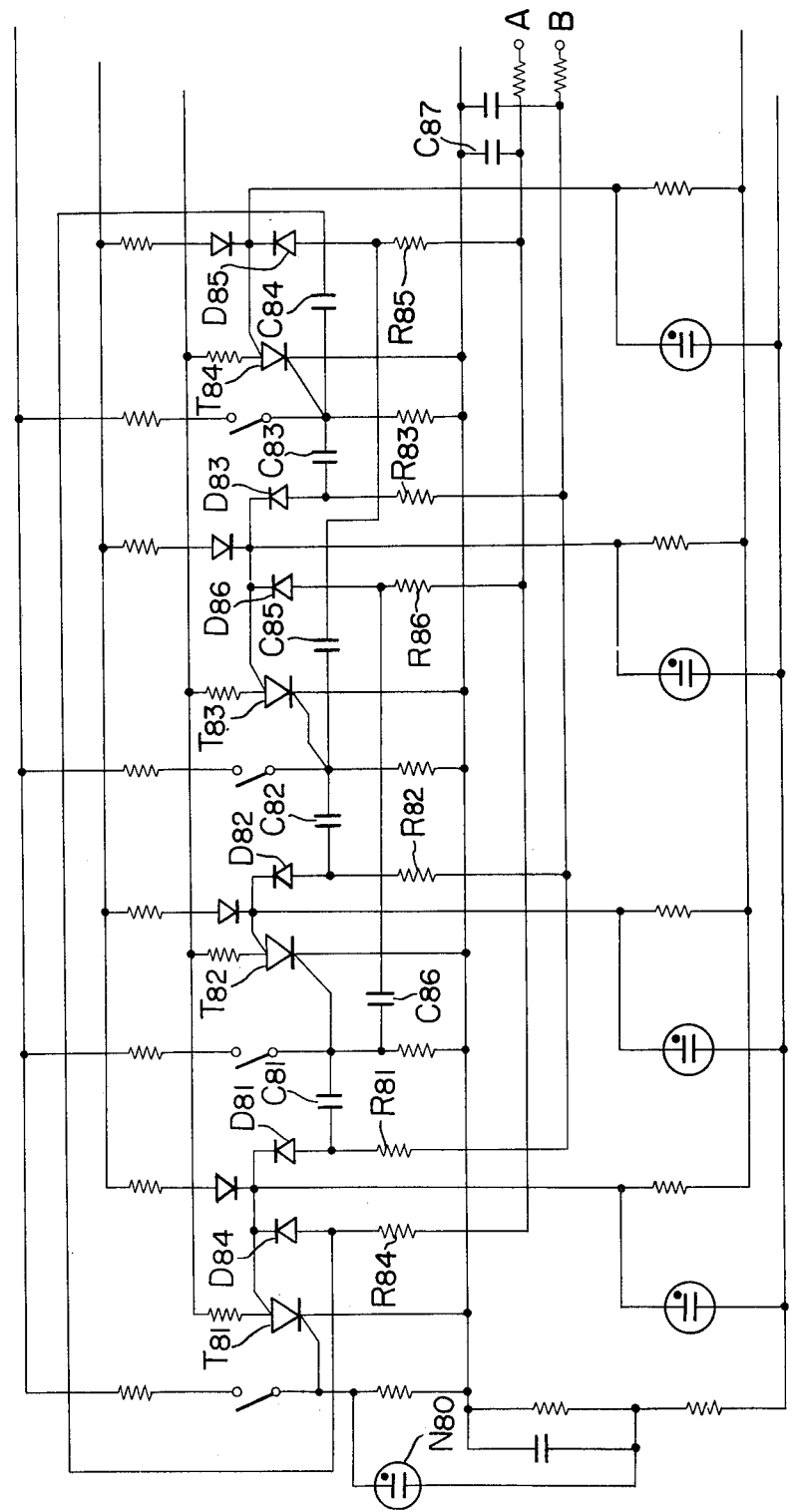

Fourth Embodiment, FIG. 8

Referring to FIG. 8, there is shown the remote-controlled electronic switch which may be shifted in either direction and which is substantially similar in construction to the third embodiment shown in FIG. 7 except that the fourth embodiment further includes diodes D81 through D83, capacitors C81 through C83, and resistors R81 through R83 for shifting the turning-on of the thyristors T81 through T84 in the order named, that is, for the right shift, and diodes D84 through D86, capacitors C84 through C86 and resistors R84 through R86 for the left shift; that is, in the order of T81, T84, T83, T82, T81 and so on.

Next, the mode of operation will be described. When the electronic switch is connected to the power supply, the thyristor T81 is turned on in the manner described above. When the voltage signal is applied to the terminal A, the electronic switch makes the left shift, that is, in the order of T81, T84, T83 and T82. Thereafter, all of the thyristors T81 through T84 are turned off, and then the thyristor T81 is turned on again as the neon bulb N80 is turned on in the manner described above. In like manner, in response to the voltage pulse signal applied to the terminal B, the electronic switch makes the right shift, that is, in the order of T81, T82, T83 and T84. Thereafter, all of the thyristors are turned off, and then the thyristor T81 is turned on in the manner described above. The function of the capacitor C87 is same with that of the capacitor C72 explained with reference to FIG. 7.

It is apparent that the electronic switches in accordance with the present invention find a variety of applications in many fields in addition to the application to the device for switching variable resistors for fine tuning.

So far the preferred embodiments of the present invention have been described, but it will be understood that the present invention is not limited thereto and that various modifications may be effected within the true spirit of the present invention.

What is claimed is:
1. An electronic switch comprising
   a. a plurality of thyristors each with the P- and N-gates, which are connected in parallel and whose cathodes are connected in common,
   b. switching means connected to the anode circuits of said thyristors,
   c. detector means whose input is connected to the N-gate circuits of said thyristors and whose output is connected to said switching means for operating said switching means to block said thyristor anode circuits in response to the conduction of more than one of said thyristors, and
   d. a plurality of input terminals each connected to the P-gate of each thyristor.
2. An electronic switch as set forth in claim 1 wherein a fine-tuning variable resistor is connected to the N-gate circuit of each thyristor.
3. An electronic switch as set forth in claim 2 wherein a switch is connected to the P-gate circuit of each thyristor.
4. An electronic switch as set forth in claim 3 wherein a gate resistor is connected in series to said switch, and is connected through a common gate voltage dividing resistor to a power supply means.

5. An electronic switch as set forth in claim 2 wherein a transistor and an exposed conductor means are connected in the P-gate circuit of each thyristor.

6. An electronic switch as set forth in claim 5 wherein a gate resistor is connected in series to the collector of said transistor and is connected through a common gate voltage dividing resistor to a power supply means.

7. An electronic switch as set forth in claim 2 wherein A zener diode is interconnected between the P-gate and anode circuit of one of said plurality of thyristors.

8. An electronic switch as set forth in claim 2 wherein a light-emitting display means is connected to the anode circuit of each thyristor.

9. An electronic switch as set forth in claim 2 wherein a detecting resistor is connected in series to the N-gate circuit of each thyristor, and is connected through a common detecting resistor to a power supply means.

10. An electronic switch as set forth in claim 9 wherein the junction between said detecting resistors and said common detecting resistor is connected to the input of said detector means.

11. An electronic switch as set forth in claim 2 wherein a light-emitting display means is connected to the N-gate circuit of each thyristor.

12. An electronic switch as set forth in claim 11 wherein said light-emitting display means is a neon bulb.

13. An electronic switch as set forth in claim 12 wherein the common junction of one electrodes of said neon bulbs is grounded through a capacitor.

14. An electronic switch as set forth in claim 13 wherein the P-gate of one of said plurality of thyristors is connected through a neon bulb to the common junction of one electrodes of said neon lamps.

15. An electronic switch as set forth in claim 2 wherein said switching means includes
   a. input terminal means, and
   b. capacitor means interconnected between the N-gate of the thyristor and the P-gate of the thyristor in the next stage.

16. An electronic switch as set forth in claim 15 wherein one end of a first series circuit consisting of a diode and a resistor is connected to the N-gate of each thyristor and the other end thereof is connected to a remote-control voltage supply means; and capacitor means is interconnected between the junction between said diode and resistor of said series circuit and the P-gate of the thyristor in the next stage.

17. An electronic switch as set forth in claim 16 wherein a second series circuit consisting of a diode and a resistor is interconnected between the N-gate of each thyristor and said remote-control voltage supply means.

18. An electronic switch as set forth in claim 17 wherein capacitor means is interconnected between the junction of said diode and resistor of said second series circuit and the P-gate of the thyristor in the preceding stage.

19. An electronic switch as set forth in claim 1 wherein a switch is connected to the P-gate circuit of each thyristor.

20. An electronic switch as set forth in claim 19 wherein a gate resistor is connected in series to said switch, and connected through a common gate voltage dividing resistor to a power supply means.

21. An electronic switch as set forth in claim 1 wherein a transistor and an exposed conductor means are connected to the P-gate circuit of each thyristor.

22. An electronic switch as set forth in claim 21 wherein a gate resistor is connected in series to the collector of said transistor, and is connected through a common gate voltage dividing resistor to a power supply means.

23. An electronic switch as set forth in claim 1 wherein a detecting resistor is connected in series to the N-gate circuit of each thyristor, and is connected through a common detecting resistor to a power supply means.

24. An electronic switch as set forth in claim 23 wherein the junction between said detecting resistors and said common detecting resistor is connected to the input of said detector means.

25. An electronic switch as set forth in claim 1 wherein each thyristor consists of the combination of an NPN transistor and a PNP transistor.

26. An electronic switch as set forth in claim 1 wherein A zener-diode is interconnected between the P-gate and anode circuit of one of said plurality of thyristors.

27. An electronic switch as set forth in claim 1 wherein a light-emitting display means is connected to the N-gate circuit of each thyristor.

28. An electronic switch as set forth in claim 27 wherein said light-emitting means is a neon bulb.

29. An electronic switch as set forth in claim 28 wherein the common junction of one electrodes of said neon bulbs is grounded through a capacitor.

30. An electronic switch as set forth in claim 28 wherein the P-gate of one of said plurality of thyristors is connected through a neon bulb to the common junction of one electrodes of said neon bulbs.

31. An electronic switch as set forth in claim 1 wherein said switching means includes
   a. input terminal means, and
   b. capacitor means interconnected between the N-gate of the thyristor and the P-gate of the thyristor in the next stage.

32. An electronic switch as set forth in claim 31 wherein one end of a first series circuit consisting of a diode and a resistor is connected to the N-gate of each thyristor and the other end thereof is connected to a remote-control voltage supply means; and capacitor means is interconnected between the junction between said diode and resistor of said series circuit and the P-gate of the thyristor in the next stage.

33. An electronic switch as set forth in claim 30 wherein a second series circuit consisting of a diode and a resistor is interconnected between the N-gate of each thyristor and said remote-control voltage supply means.

34. An electronic switch as set forth in claim 33 wherein capacitor means is interconnected between the junction between said diode and resistor of said second series circuit and the P-gate of the thyristor in the preceding stage.

35. An electronic switch as set forth in claim 1 wherein a light-emitting display means is connected to the anode circuit of each thyristor.

* * * * *

UNITED STATES PATENT OFFICE
CERTIFICATE OF CORRECTION

Patent No. 4,027,230            Dated May 31, 1977

Inventor(s) Takehide Takemura

It is certified that error appears in the above-identified patent and that said Letters Patent are hereby corrected as shown below:

Column 1, line 23, "the" should read -- a --.

Column 1, line 30, "a" should be deleted.

Column 1, line 52, "the" should read -- an --.

Column 3, line 1, "an" should read -- as --.

Column 3, line 53, after "Ea21" -- which -- should be inserted.

Column 8, line 15, "shift;" should read -- shift, --.

Column 9, lines 31 and 36, "one electrodes" should read -- one electrode --.

Column 10, lines 33 and 38, "one electrodes" should read -- one electrode --.

Signed and Sealed this

Eleventh Day of April 1978

[SEAL]

Attest:

RUTH C. MASON  
Attesting Officer

LUTRELLE F. PARKER  
Acting Commissioner of Patents and Trademarks